(12) United States Patent
Sui et al.

(10) Patent No.: US 12,213,350 B2
(45) Date of Patent: Jan. 28, 2025

(54) DISPLAY PANEL AND METHOD FOR MANUFACTURING THE SAME, AND DISPLAY APPARATUS

(71) Applicant: BOE TECHNOLOGY GROUP CO., LTD., Beijing (CN)

(72) Inventors: Kai Sui, Beijing (CN); Qian Jin, Beijing (CN); Xiaofen Wang, Beijing (CN); Jinxiang Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 684 days.

(21) Appl. No.: 17/419,608

(22) PCT Filed: Sep. 23, 2020

(86) PCT No.: PCT/CN2020/116979
§ 371 (c)(1),
(2) Date: Jun. 29, 2021

(87) PCT Pub. No.: WO2021/057757
PCT Pub. Date: Apr. 1, 2021

(65) Prior Publication Data
US 2022/0085124 A1    Mar. 17, 2022

(30) Foreign Application Priority Data
Sep. 27, 2019    (CN) .......................... 201910927307.9

(51) Int. Cl.
*H10K 59/124*    (2023.01)
*H10K 50/822*    (2023.01)
(Continued)

(52) U.S. Cl.
CPC ......... *H10K 59/124* (2023.02); *H10K 50/822* (2023.02); *H10K 50/846* (2023.02);
(Continued)

(58) Field of Classification Search
CPC . H10K 59/131; H10K 59/1201; H10K 59/124
See application file for complete search history.

(56) References Cited

U.S. PATENT DOCUMENTS 10,541,380 B1 * 1/2020 Sung ..................... H10K 59/124
2017/0323936 A1   11/2017 Lee et al.
(Continued)

FOREIGN PATENT DOCUMENTS

| CN | 108539037 A | 9/2018 | |
| CN | 108899352 A * | 11/2018 | ............. G03F 7/094 |

(Continued)

OTHER PUBLICATIONS

First Office Action of Priority Application No. CN 201910927307.9 issued by the Chinese Patent Office on Apr. 27, 2021.

*Primary Examiner* — Vincent Wall
(74) *Attorney, Agent, or Firm* — IP & T GROUP LLP

(57) ABSTRACT

A display panel is provided. The display panel includes a base and at least one display unit disposed on the base. One display unit has an active area and a peripheral area surrounding the active area. The display unit includes a cathode disposed above the base, a film encapsulation layer disposed above the base, and at least one cathode blocking structure disposed on a side of the cathode proximate to the base in a thickness direction of the base.

8 Claims, 11 Drawing Sheets

(51) Int. Cl.
*H10K 50/84* (2023.01)
*H10K 59/12* (2023.01)
*H10K 71/00* (2023.01)
*H10K 77/10* (2023.01)
*H10K 102/00* (2023.01)

(52) U.S. Cl.
CPC ......... *H10K 71/00* (2023.02); *H10K 59/1201* (2023.02); *H10K 77/111* (2023.02); *H10K 2102/311* (2023.02)

(56) References Cited

U.S. PATENT DOCUMENTS

| | | |
|---|---|---|
| 2019/0035860 A1 | 1/2019 | Oh et al. |
| 2019/0267570 A1 | 8/2019 | Huang et al. |
| 2020/0027936 A1* | 1/2020 | Wang .................. H10K 59/122 |
| 2021/0028249 A1 | 1/2021 | Ding et al. |
| 2021/0257434 A1 | 8/2021 | Xie et al. |

FOREIGN PATENT DOCUMENTS

| | | |
|---|---|---|
| CN | 109935730 A | 6/2019 |
| CN | 110265583 A | 9/2019 |
| CN | 110544714 A | 12/2019 |
| KR | 10-2019-0048782 A | 5/2019 |

* cited by examiner

A-A'

B-B'

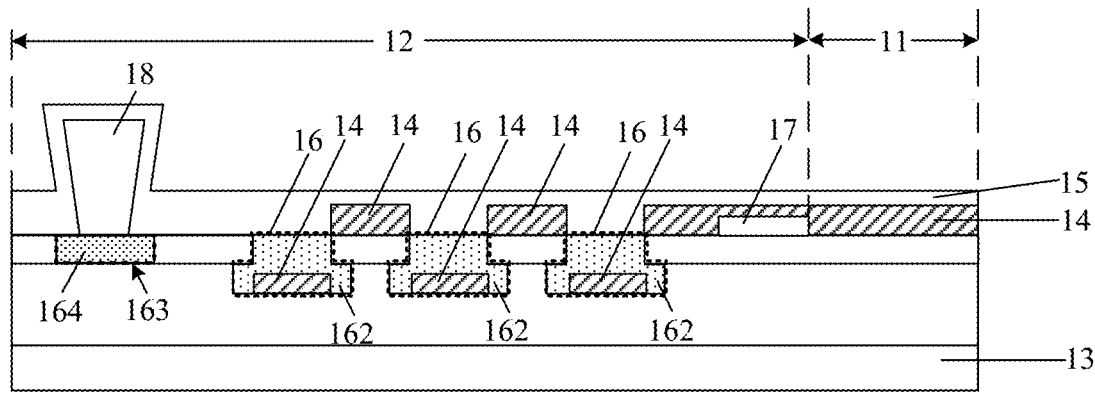

FIG. 8

| Form at least one cathode blocking structure above the base, and the at least one cathode blocking structure is located in the peripheral area | ~S10 |

| Form a cathode above the base above which the at least one cathode blocking structure has been formed; the cathode is located in the active area and the peripheral area, and the cathode is separated at the position of the at least one cathode blocking structure | ~S11 |

| Form a film encapsulation layer on a side of the cathode facing away from the base; the film encapsulation layer covers the cathode, and an edge of the film encapsulation layer extends beyond an edge of the cathode | ~S12 |

FIG. 9

DISPLAY PANEL AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2020/116979 filed on Sep. 23, 2020, which claims priority to Chinese Patent Application No. 201910927307.9, filed on Sep. 27, 2019, which are incorporated herein by reference in their entirety.

TECHNICAL FIELD

The present disclosure relates to the field of display technologies, and in particular, to a display panel and a method for manufacturing the same, and a display apparatus.

BACKGROUND

Organic light-emitting diode (OLED) is a technology that uses organic semiconductor materials and light-emitting materials to achieve light emission under current drive and achieve display. Compared with a liquid crystal display (LCD) apparatus, an OLED display apparatus has the advantages of being ultra-light, ultra-thin (thickness of which may be less than 1 mm), high brightness, large viewing angle (up to 170 degrees), emitting light from the pixel itself without a backlight, low power consumption, fast response speed, high definition, low heat generation, excellent shock resistance, bendable, etc.

SUMMARY

In an aspect, a display panel is provided. The display panel includes a base and at least one display unit disposed on the base, and one display unit has an active area and a peripheral area surrounding the active area. The display unit includes a cathode, a film encapsulation layer and at least one cathode blocking structure which are disposed above the base. The cathode is located in the active area and the peripheral area. The film encapsulation layer is disposed on a side of the cathode facing away from the base. The film encapsulation layer covers the cathode, and an edge of the film encapsulation layer extends beyond an edge of the cathode. The at least one cathode blocking structure is disposed on a side of the cathode proximate to the base and located in the peripheral area. Each cathode blocking structure is configured such that the cathode is disconnected at a position of the cathode blocking structure.

In some embodiments, each cathode blocking structure is disposed around the active area.

In some embodiments, the at least one cathode blocking structure includes a plurality of cathode blocking structures, and the plurality of cathode blocking structures are arranged separately.

In some embodiments, the substrate includes a plurality of islands separated from each other and a plurality of bridges connecting the plurality of islands. A region in which each island is located is a region in which the display unit is located; and there is a connecting line disposed on a bridge. The display unit further includes a connection electrode disposed above the base. The connection electrode is located in the peripheral area, the connection electrode is disposed on the side of the cathode proximate to the base, and the connection electrode is directly connected to the cathode. Any cathode blocking structure disposed at a same side of the active area as the connection electrode is disposed at a side of the connection electrode away from the active area. Any two connection electrodes disposed on different islands are electrically connected through the connecting line disposed on the bridge.

In some embodiments, each cathode blocking structure is a groove disposed in at least one insulation layer. At a boundary of the active area where the cathode blocking structure is provided, a cross section of the groove cut by a plane perpendicular to the boundary has an inverted T shape.

In some embodiments, the display unit further includes at least one first organic filling pattern. Each first organic filling pattern is filled at a position of a corresponding cathode blocking structure, and a surface of the first organic filling pattern facing away from the base is flush with a surface of the at least one insulation layer facing away from the base.

In some embodiments, the first organic filling pattern includes an organic material and desiccant doped in the organic material.

In some embodiments, the at least one insulation layer includes two insulation layers that are stacked. The cathode blocking structure includes a first sub-groove and a second sub-groove that are stacked and communicated in a thickness direction of the base, and the first sub-groove and the second sub-groove are respectively disposed in the two insulation layers.

In some embodiments, the display unit further includes: a plurality of pixel driving circuits disposed on the base and located in the active area, a planarization layer disposed on a side of the plurality of pixel driving circuits facing away from the base, and a plurality of anodes and a plurality of light-emitting functional layers disposed on a side of the planarization layer facing away from the base. The pixel driving circuit includes a plurality of thin film transistors, and at least one thin film transistor includes a semiconductor active pattern, a gate, a portion of an interlayer insulation layer located in a region in which the at least one thin film transistor is located, a source and a drain that are sequentially disposed on the base. The source and the drain are in contact with the semiconductor active pattern at least through first via holes in the interlayer insulation layer. Each light-emitting functional layer is located between a corresponding anode and the cathode. The anode is connected to the pixel driving circuit through a second via hole in the planarization layer. The two insulation layers are the interlayer insulation layer and the planarization layer.

In some embodiments, the display unit further includes a barrier block disposed on a side of the film encapsulation layer proximate to the base. The barrier block is disposed in the peripheral area. At a boundary of the active area where the cathode blocking structure and the barrier block are provided, the barrier block is located at a side of the cathode blocking structure away from the active area. At a boundary of the active area where the barrier block is provided, a cross section of the barrier block cut by a plane perpendicular to the boundary is an inverted trapezoid.

In some embodiments, the cathode blocking structure is a groove provided in at least one insulation layer. The display unit further includes a depression portion and a second organic filling pattern. The depression portion is disposed in the at least one insulation layer, and an orthogonal projection of the depression portion on the base overlaps with an orthogonal projection of the barrier block on the base. The second organic filling pattern is filled in the depression portion. A surface of the second organic filling pattern facing away from the base is flush with a surface of the at least one insulation layer facing away from the base. The barrier block is disposed on a surface of the second organic filling pattern facing away from the base.

In some embodiments, the second organic filling pattern includes an organic material and desiccant doped in the organic material.

In another aspect, a display apparatus is provided. The display apparatus includes the display panel.

In yet another aspect, a method for manufacturing a display panel is provided. The method includes forming at least one display unit on a base. Each display unit includes an active area and a peripheral area surrounding the active area. Forming the display unit includes: forming at least one cathode blocking structure above the base; forming a cathode above the base above which the at least one cathode blocking structure has been formed; and forming a film encapsulation layer on a side of the cathode facing away from the base; and the film encapsulation layer covering the cathode. The at least one cathode blocking structure is located in the peripheral area. The cathode is located in the active area and the peripheral area, and the cathode being disconnected at a position of the at least one cathode blocking structure. The film encapsulation layer covers the cathode, and an edge of the film encapsulation layer extends beyond an edge of the cathode.

In some embodiments, each cathode blocking structure is a groove formed in at least one insulation layer. At a boundary of the active area where the cathode blocking structure has been formed, a cross section of the groove cut by a plane perpendicular to the boundary has an inverted T shape.

In some embodiments, before forming the cathode, forming the display unit further includes: forming a plurality of pixel driving circuits on the base and the plurality of pixel driving circuits being located in the active area, forming a planarization layer on the base on which the plurality of pixel driving circuits have been formed, and forming a plurality of anodes and a plurality of light-emitting functional layers disposed on a side of the planarization layer facing away from the base. At least one pixel driving circuit includes a plurality of thin film transistors, and a thin film transistors includes a semiconductor active pattern, a gate, a portion of an interlayer insulation layer located in a region in which the thin film transistor is located, a source and a drain that are sequentially disposed on the base; and the source and the drain are in contact with the semiconductor active pattern at least through first via holes in the interlayer insulation layer. Each light-emitting functional layer being located between a corresponding anode and the cathode; and the anode being connected to a pixel driving circuit through a second via hole in the planarization layer. The at least one insulation layer includes the interlayer insulation layer and the planarization layer; the cathode blocking structure includes a first sub-groove and a second sub-groove that are stacked and communicated in a thickness direction of the base, the first sub-groove is located in the planarization layer and penetrates the planarization layer, and the second sub-groove is located in the interlayer insulation layer.

In some embodiments, after forming the interlayer insulation layer and before forming the planarization layer, forming the display unit further includes: filling the second sub-groove in the interlayer insulation layer with photoresist, so that a surface of the photoresist facing away from the base is flush with a surface of the interlayer insulation layer facing away from the base; and exposing the photoresist. On this basis, after forming the planarization layer and before forming the cathode, forming the display unit further includes: developing the photoresist filled in the second sub-groove.

In some embodiments, after forming the cathode and before forming the film encapsulation layer, forming the display unit further includes: filling and curing a first organic filling pattern at a position of the cathode blocking structure. A surface of the first organic filling pattern facing away from the base is flush with a surface of the planarization layer facing away from the base; and the first organic filling pattern includes an organic material and desiccant doped in the organic material.

In some embodiments, after forming the planarization layer and before developing the photoresist filled in the second sub-groove, forming the display unit further includes: forming a barrier block in the peripheral area. At a boundary of the active area where the cathode blocking structure and the barrier block have been formed, the barrier block is located at a side of the cathode blocking structure away from the active area. At a boundary of the active area where the barrier block has been formed, a cross section of the barrier block cut by a plane perpendicular to the boundary is an inverted trapezoid.

In some embodiments, while forming the first sub-groove and the second via hole in the planarization layer, a depression portion located in the peripheral area is also formed in the planarization layer. An orthogonal projection of the depression portion on the base overlaps with an orthogonal projection of the barrier block on the base. Before developing the photoresist filled in the second sub-groove, forming the display unit further includes filling and curing the depression portion with a second organic filling pattern. A surface of the second organic filling pattern facing away from the base is flush with a surface of the planarization layer facing away from the base. The second organic filling pattern includes an organic material and desiccant doped in the organic material. The barrier block is in contact with the surface of the second organic filling pattern facing away from the base.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

FIG. 8 is yet another cross-sectional view taken along the B-B' direction in FIG. 2A, in accordance with some embodiments;

FIG. 9 is a flow diagram of a method for manufacturing a display panel, in accordance with some embodiments;

DETAILED DESCRIPTION

Figure 1A:
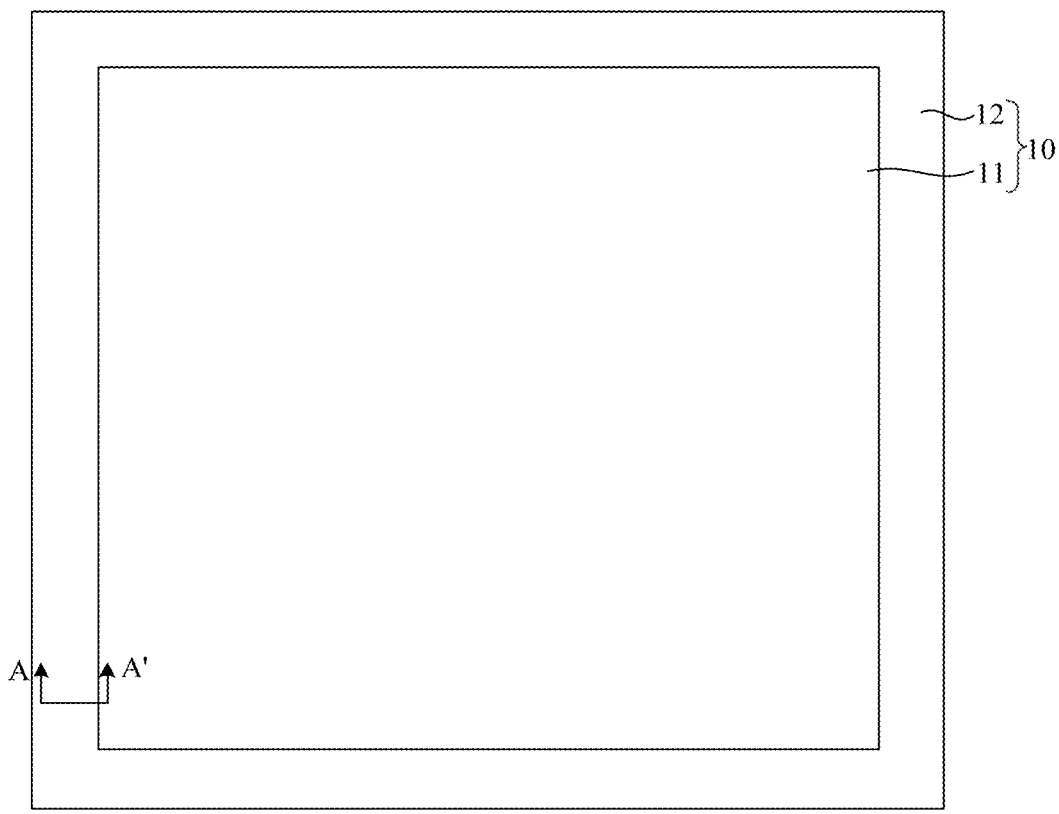
FIG. 1A is a schematic diagram of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", and "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials, or characteristics may be included in any one or more embodiments or examples in any suitable manner.

Below, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and its extensions may be used. For example, the term "connected" may be used in the description of some embodiments to indicate that two or more components are in direct physical contact or electrical contact with each other. The embodiments disclosed herein are not necessarily limited to the contents herein.

The expression such as "configured to" means an open and inclusive language, which does not exclude devices that are suitable for or configured to perform additional tasks or steps.

Exemplary embodiments are described herein with reference to sectional views and/or plan views as idealized exemplary drawings. In the accompanying drawings, thicknesses of layers and regions are enlarged for clarity. Exemplary embodiments of the present disclosure should not be construed to be limited to shapes of regions shown herein, but to include deviations in the shapes due to, for example, manufacturing. For example, an etched region that has a rectangular shape generally has a curved feature. Therefore, the regions shown in the accompanying drawings are schematic in nature, and their shapes are not intended to show actual shapes of the regions in an apparatus, and are not intended to limit the scope of the exemplary embodiments.

Figure 1B:
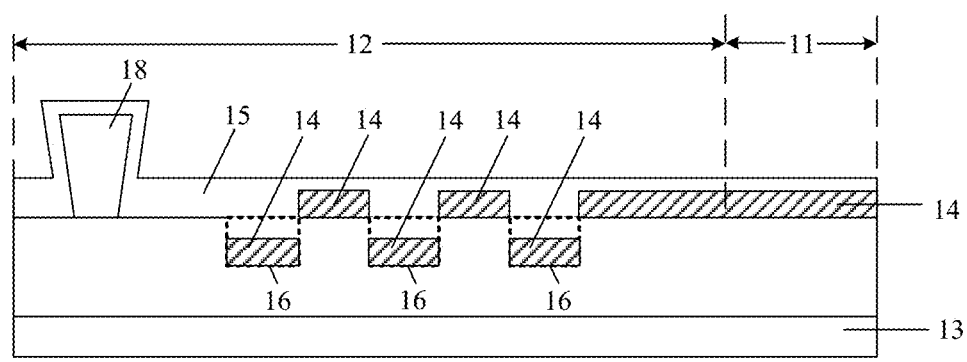
FIG. 1B is a cross-sectional view taken along an A-A' direction in FIG. 1A, in accordance with some embodiments.
Figure 1C:
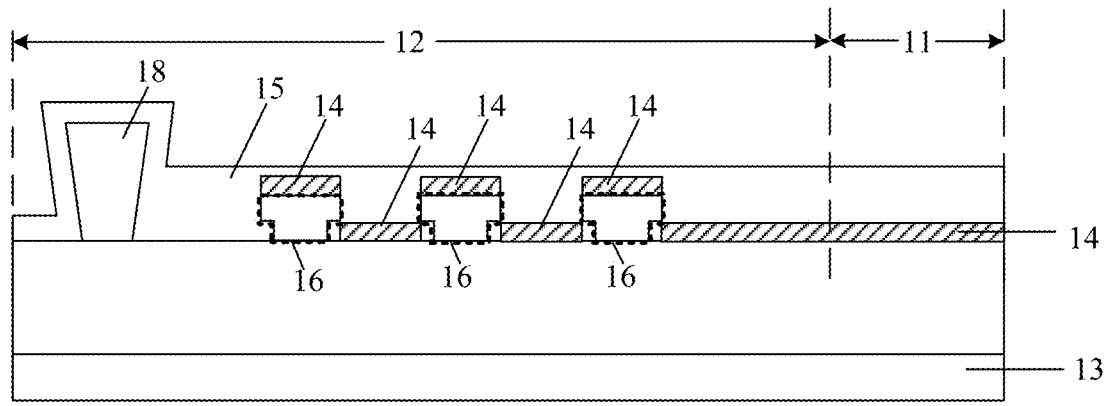
FIG. 1C is another cross-sectional view taken along the A-A' direction in FIG. 1A, in accordance with some embodiments.

As shown in FIGS. 1A to 1C, some embodiments of the present disclosure provide a display panel 1. The display panel 1 includes a base 13 and at least one display unit 10 disposed on the base 13, and one display unit 10 has an active area 11 and a peripheral area 12 surrounding the active area 11. In some examples, each display unit 10 has an active area 11 and a peripheral area 12 surrounding the active area 11.

As shown in FIGS. 1B and 1C, the display unit 10 includes a cathode 14, a film encapsulation layer 15 and at least one cathode blocking structure 16 disposed above the base 13. The cathode 14 is located at the active area 11 and extends to the peripheral area 12. The film encapsulation layer 15 is disposed on a side of the cathode 14 facing away from the base 13, the film encapsulation layer 15 covers the cathode 14, and an edge of the film encapsulation layer 15 extends beyond an edge of the cathode 14. At least one cathode blocking structure 16 is disposed at a side of the cathode 14 proximate to the base 13 in a thickness direction of the base 13 and located in the peripheral area 12, and each cathode blocking structure 16 is configured such that the cathode 14 is disconnected at a position of the cathode blocking structure 16.

There is one cathode blocking structure 16. Or, there are a plurality of cathode blocking structures 16, and the plurality of cathode blocking structures 16 are arranged separately.

Figure 1D:
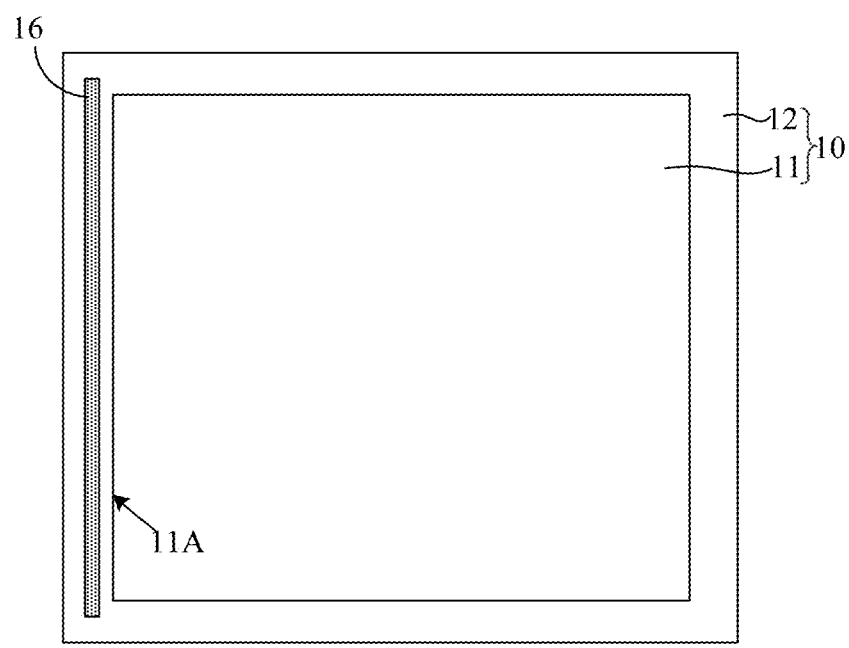
FIG. 1D is a schematic diagram of an arrangement manner of at least one cathode blocking structure in a display unit, in accordance with some embodiments.

In some examples, as shown in FIG. 1D, the at least one cathode blocking structure 16 includes one cathode blocking structure 16, and the cathode blocking structure 16 is located in the peripheral area 12 at a side of the active area 11. For example, the cathode blocking structure 16 is located at a first boundary 11A of the active area 11, and in an extending direction of the first boundary 11A, the cathode blocking structure 16 extends beyond the cathode 14 or is flush with the cathode 14. Thus, the cathode 14 is divided into a main body portion and a first edge portion. The first edge portion is located in the peripheral area 12, the main body portion is located in the active area 11 and the peripheral area 12, and a side face of the main body portion facing the first edge portion is disconnected from the first edge portion.

Figure 1E:
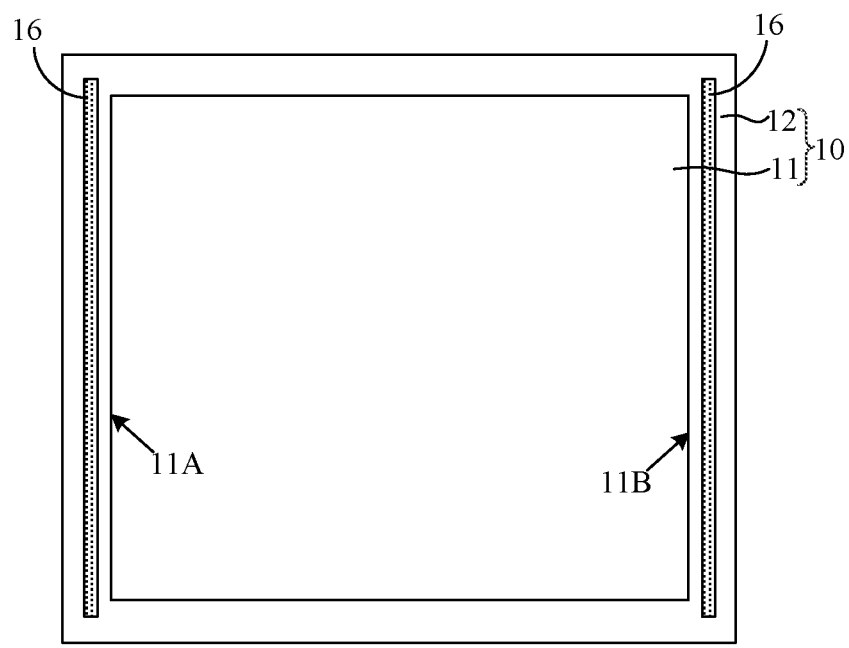
FIG. 1E is a schematic diagram of an arrangement manner of at least one cathode blocking structure in another display unit, in accordance with some embodiments.

In some other examples, as shown in FIG. 1E, the at least one cathode blocking structure 16 includes two cathode blocking structures 16, and the two cathode blocking structures 16 are located in the peripheral area 12 at two sides of the active area 11. For example, one of the two cathode blocking structures 16 is located at the first boundary 11A of the active area 11, and in the extending direction of the first boundary 11A, the cathode blocking structure 16 extends beyond the cathode 14 or is flush with the cathode 14. The other of the two cathode blocking structures 16 is located at a second boundary 11B of the active area 11, and in an extending direction of the second boundary 11B, the cathode blocking structure 16 extends beyond the cathode 14 or is flush with the cathode 14. Thus, the cathode 14 is divided into a main body portion, a first edge portion and a second edge portion. The first edge portion and the second edge portion are located in the peripheral area 12, and the main body portion is located in the active area 11 and the peripheral area 12. The side face of the main body portion facing the first edge portion is disconnected from the first edge portion, and a side face of the main body portion facing the second edge portion is disconnected from the second edge portion. Here, the first boundary and the second boundary of the active area 11 may be adjacent boundaries or opposite boundaries.

Figure 1F:
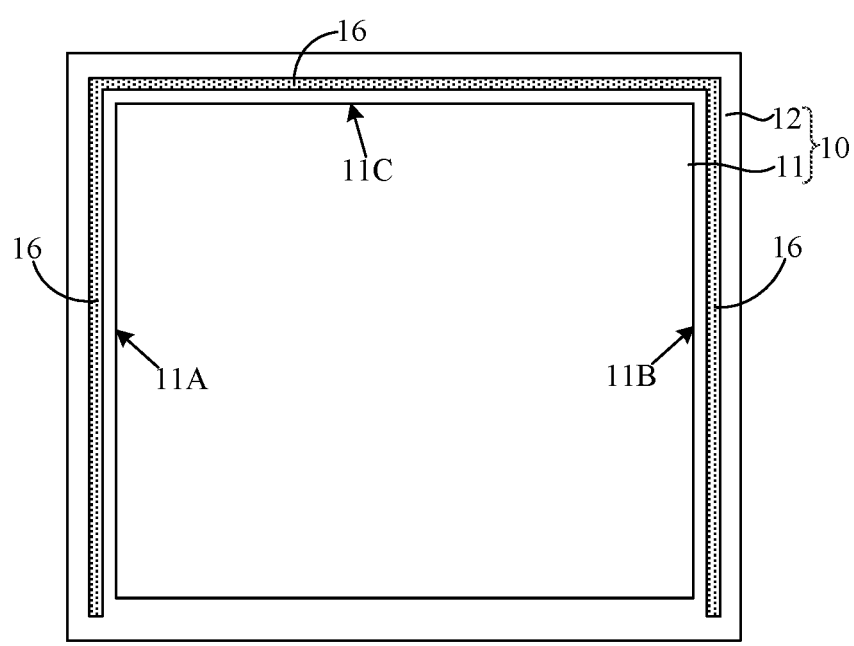
FIG. 1F is a schematic diagram of an arrangement manner of at least one cathode blocking structure in yet another display unit, in accordance with some embodiments.

In some other examples, as shown in FIG. 1F, the at least one cathode blocking structure 16 includes three cathode blocking structures 16, the three cathode blocking structures 16 are located in the peripheral area 12 at three sides of the active area 11, and the three cathode blocking structures 16 are connected as an integrated structure. A first cathode blocking structure 16 of the three cathode blocking structures 16 is located at the first boundary 11A of the active area 11, and in the extending direction of the first boundary 11A, the first cathode blocking structure 16 extends beyond the cathode 14 or is flush with the cathode 14. A second cathode blocking structure 16 of the three cathode blocking structures 16 is located at the second boundary 11B of the active area 11, and in the extending direction of the second boundary 11B, the second cathode blocking structure 16 extends beyond the cathode 14 or is flush with the cathode 14. A third cathode blocking structure 16 of the three cathode blocking structures 16 is located at a third boundary 11C of the active area 11, and in an extending direction of the third boundary 11C, the third cathode blocking structure 16 extends beyond the cathode 14 or is flush with the cathode 14. Thus, the cathode 14 is divided into a main body portion, a first edge portion, a second edge portion and a third edge portion. The first edge portion, the second edge portion and the third edge portion are located in the peripheral area 12, and the main body portion is located in the active area 11 and the peripheral area 12. The side face of the main body portion facing the first edge portion is disconnected from the first edge portion, the side face of the main body portion facing the second edge portion is disconnected from the second edge portion, and a side face of the main body portion facing the third edge portion is disconnected from the third edge portion.

Figure 1G:
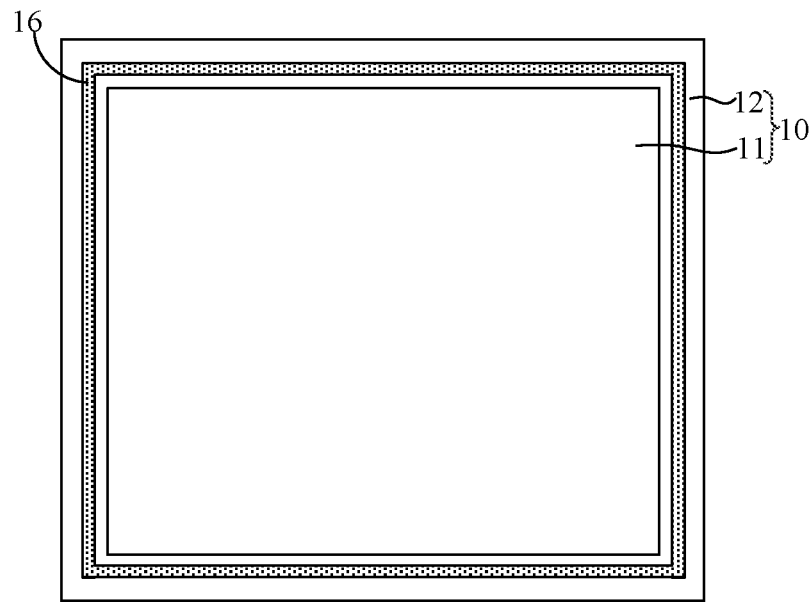
FIG. 1G is a schematic diagram of an arrangement manner of at least one cathode blocking structure in yet another display unit, in accordance with some embodiments.

In some other examples, as shown in FIG. 1G, the at least one cathode blocking structure 16 includes one cathode blocking structure 16, and the cathode blocking structure 16 is disposed around the active area 11. In this way, by arranging the cathode blocking structure 16 around the active area 11, the main body portion of the cathode 14 located in a region enclosed by the cathode blocking structure 16 may be disconnected from other portions.

Figure 1H:
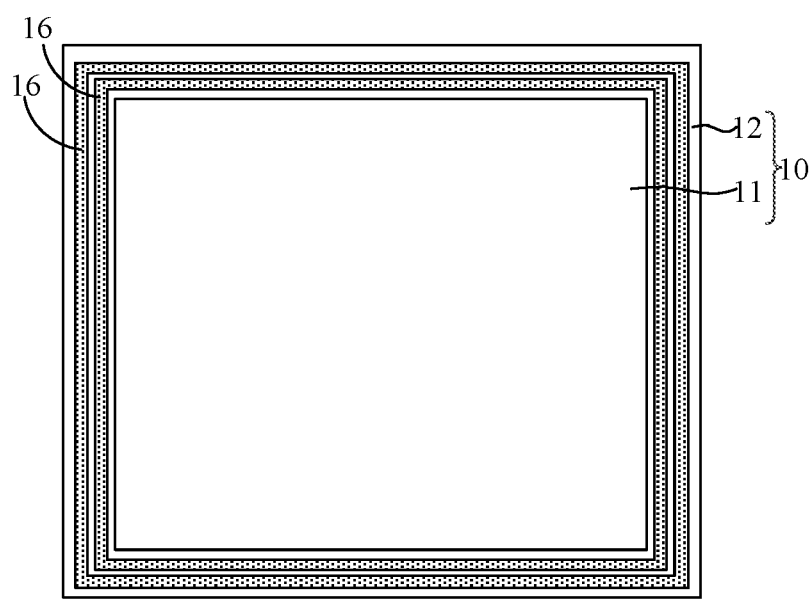
FIG. 1H is a schematic diagram of an arrangement manner of at least one cathode blocking structure in yet another display unit, in accordance with some embodiments.

In some other examples, as shown in FIG. 1H, the at least one cathode blocking structure 16 includes two cathode blocking structures 16, each cathode blocking structure 16 is disposed around the active area 11, and the two cathode blocking structures 16 are arranged separately. By arranging two cathode blocking structures 16, and each cathode blocking structure 16 being disposed around the active area 11, it may be ensured that a main body portion of the cathode 14 in a region enclosed by a cathode blocking structure 16 of the two cathode blocking structures 16 (which is closest to the active area 11) is completely disconnected from the other portions.

For example, the at least one cathode blocking structure 16 includes three cathode blocking structures 16, each cathode blocking structure 16 is disposed around the active area 11, and any two adjacent cathode blocking structures 16 of the three cathode blocking structures 16 are arranged separately.

In some examples, the at least one cathode blocking structure 16 includes a plurality of cathode blocking structures 16. At least one cathode blocking structure 16 of the plurality of cathode blocking structures 16 is disposed around the active area 11, and the remaining cathode blocking structure(s) 16 are not disposed around the active area 11.

In some examples, the cathode blocking structure 16 disposed around the active area 11 has a continuous ring structure. The ring structure may be a circular ring, a square ring or other special-shaped ring.

It will be noted that, some embodiments of the present disclosure do not limit the specific structure of the cathode blocking structure 16, as long as the cathode 14 can be divided at the position of the cathode blocking structure 16. In a case where there are a plurality of display units 10, the cathodes 14 located in different display units 10 are disconnected from each other. The film encapsulation layers 15 located in different display units 10 are disconnected from each other. That is, in the case where there are a plurality of display units 10, each display unit 10 is individually encapsulated.

In addition, the specific structure of the cathode blocking structure 16 is not limited. FIG. 1B illustrates the cathode blocking structure 16 as a groove, but the embodiments of the present disclosure are not limited thereto. For example, as shown in FIG. 1C, the cathode blocking structure 16 is a protrusion, and the specific structure of the protrusion is not limited, as long as the cathode 14 can be divided by the protrusion.

In the display panel 1 provided by some embodiments of the present disclosure, by arranging the cathode blocking structure 16 in the peripheral area 12, the cathode 14 is disconnected at the position of the cathode blocking structure 16 and the cathode 14 is divided into a main body portion and an edge portion. The main body portion is located at the side of the cathode blocking structure 16 proximate to the active area 11, and the main body portion covers the active area 11. Compared with a distance between the side face of the cathode 14 and a corresponding side face of the film encapsulation layer 15 in the case where the cathode blocking structure 16 is not disposed, the arrangement of the cathode blocking structure 16 increases a distance between the side face of the main body portion of the cathode 14 facing the cathode blocking structure 16 and the corresponding side face of the film encapsulation layer 15, thereby increasing a path of water and oxygen intrusion into the main body portion and ensuring a reliability of the encapsulation. On this basis, considering that there is an alignment problem when the cathode 14 is formed through evaporation deposition, in order to ensure that the main body portion can also be formed in a predetermined region in a case where the alignment accuracy is low, the purpose may be achieved by increasing an area of the cathode 14 that is formed through evaporation deposition. And the arrangement of the cathode blocking structure 16 may ensure the encapsulation reliability even if an overall size of the cathode 14 is large.

In some embodiments, a thickness of the film encapsulation layer 15 is in a range of 0.3 µm to 15 µm. In some examples, the thickness of the film encapsulation layer 15 is in a range of 0.5 µm to 5 µm.

For example, the thickness of the film encapsulation layer 15 is 0.3 µm, 0.5 µm, 1 µm, 1.5 µm, 1.8 µm, 2.0 µm, 3 µm, 5 µm, 8 µm, 10 µm, 12 µm, or 15 µm.

Figure 2A:
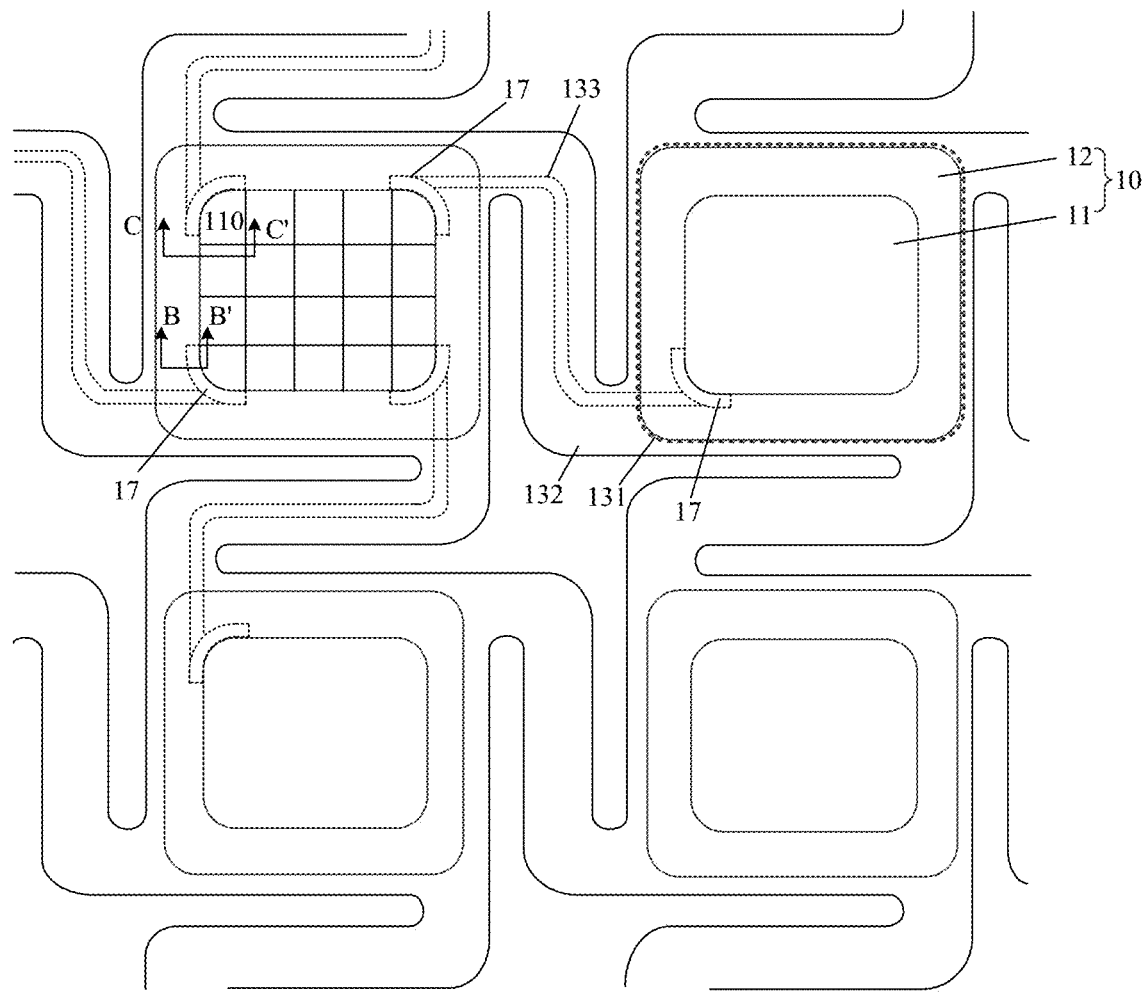
FIG. 2A is a structural diagram of another display panel, in accordance with some embodiments.
Figure 2B:
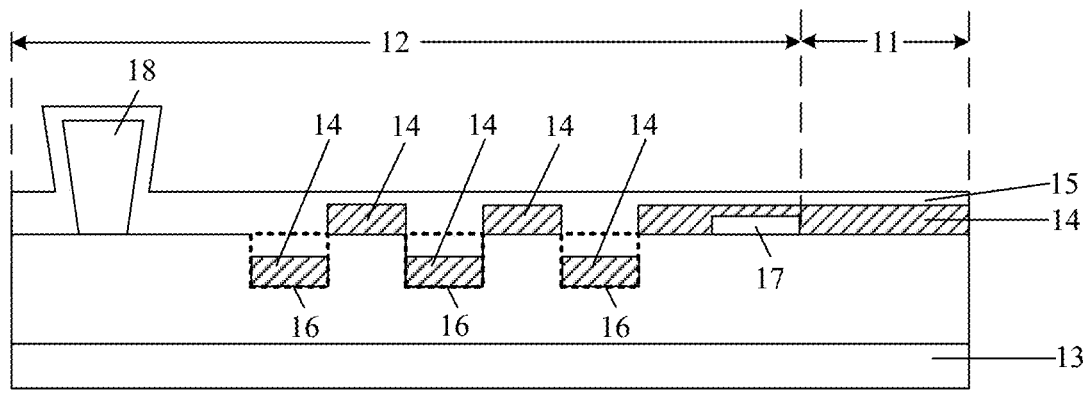
FIG. 2B is a cross-sectional view taken along a B-B' direction in FIG. 2A, in accordance with some embodiments.

In some embodiments, as shown in FIGS. 2A and 2B, the base 13 includes a plurality of islands 131 separated from each other, and a plurality of bridges 132 connecting the plurality of islands 131. A region in which each island 131 is located is a region in which one display unit 10 is located.

The display panel 1 further includes a connection electrode 17 disposed above the base 13 and located in the peripheral area 12, and the connection electrode 17 is disposed on the side of the cathode 14 proximate to the base 13 in the thickness direction of the base 13. The connection electrode 17 is directly connected to the cathode 14, that is, a surface of the cathode 14 proximate to the base 13 is in contact with a surface of the connection electrode 17 facing away from the base 13. Any cathode blocking structure 16 disposed at a same side of the active area 11 as the connection electrode 17 and any cathode blocking structure 16 is disposed at a side of the connection electrode 17 away from the active area 11. Any two connection electrodes 17 disposed on different islands 131 are electrically connected through a connecting line 133 disposed on a bridge 132. For example, any two connection electrodes 17 disposed on different islands 131 are electrically connected together through a connecting line 133 disposed on a bridge 132.

Since the cathodes 14 located on different islands 131 are independent of each other, in order to supply power to the cathodes 14 on all islands 131, by connecting the cathode 14 on each island 131 with the connection electrode 17, and electrically connecting any two connection electrodes 17 through a connecting line 133, the cathodes 14 on all the islands 131 can be electrically connected.

In a case where the base 13 includes a plurality of islands 131 separated from each other and a plurality of bridges 132 connecting the plurality of islands 131, the display panel 1 is a stretchable display panel. The stretchable display panel has space, and a certain stretch performance is achieved through the expansion and contraction of the space.

In some examples, a side length of each island 131 (i.e., each display unit 10) is in a range of 50 µm to 2000 µm.

Figure 3A:
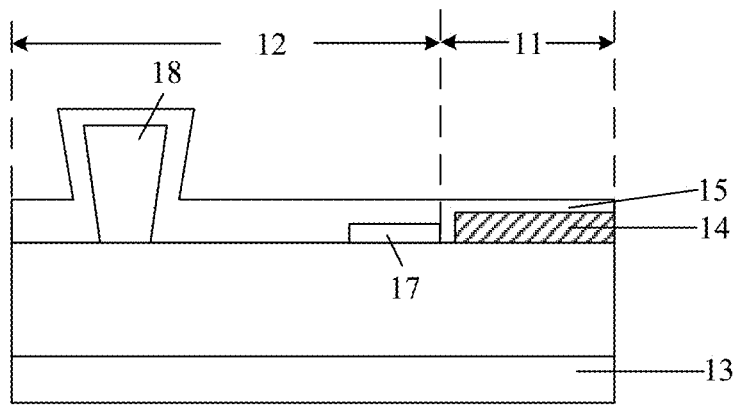
FIG. 3A is a cross-sectional view of a display panel in the related art.
Figure 3B:
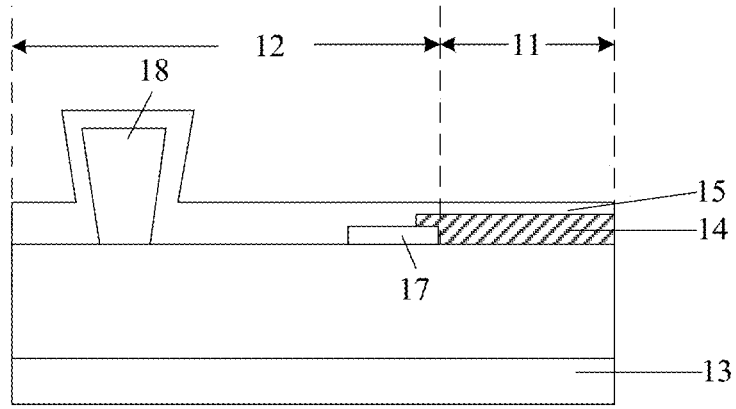
FIG. 3B is a cross-sectional view of another display panel in the related art.

In a case where the side length of the display unit 10 is in a small range, an area of the display unit 10 is also small. In order to achieve a high resolution of the display panel 1, there is a need to increase the number of pixels in the display unit 10 as much as possible, which will reduce an area of the peripheral area 12 in the display unit 10. However, in a case where the area of the peripheral area 12 in the display unit 10 is small, without providing the cathode blocking structure 16 in the embodiments of the present disclosure, the position of the cathode 14 formed through evaporation deposition is challenging. Due to the shadow effect during the evaporation deposition process and the alignment accuracy problem, it is easy to cause a situation where the cathode 14 and the connection electrode 17 fail to overlap (as shown in FIG. 3A). As a result, the screen cannot light up. Or, an overlapping area between the cathode 14 and the connection electrode 17 is small (as shown in FIG. 3B), and a phenomenon that a driving voltage of the display panel increases will occur.

In the stretchable display panel of some embodiments of the present disclosure, since the cathode blocking structure 16 is provided, the overall size of the cathode 14 may be larger. In this way, even if the alignment accuracy is low, the main body portion of the cathode 14 and the connection electrode 17 can fully overlap, and there is no problem of encapsulation reliability.

Figure 4:
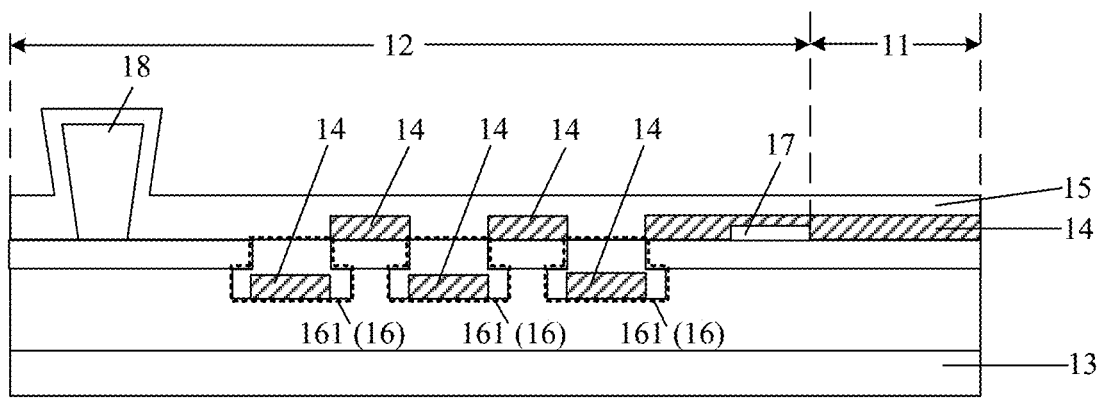
FIG. 4 is another cross-sectional view taken along the B-B' direction in FIG. 2A, in accordance with some embodiments.

As shown in FIG. 4, each cathode blocking structure 16 is a groove 161 disposed on at least one insulation layer. At a boundary of the active area 11 where the cathode blocking structure(s) 16 are disposed, a cross section of the groove 161 cut by a plane perpendicular to the boundary has an inverted T shape.

For example, in a case where the groove 161 is located at the first boundary 11A of the active area 11, a cross section of the groove 161 cut by a plane perpendicular to the first boundary 11A has an inverted T shape. For another example, in a case where the groove 161 is located at the second boundary 11B of the active area 11, a cross section of the groove 161 cut by a plane perpendicular to the second boundary 11B has an inverted T shape. For another example, in a case where the groove 161 is disposed around the active area 11, a cross section of a part of the groove 161 located at each boundary of the active area 11 cut by a plane perpendicular to the boundary has an inverted T shape.

In some embodiments, a depth of the inverted T-shaped groove is in a range of 0.5 µm to 7 µm in a thickness direction of the base 13. In some examples, the depth of the inverted T-shaped groove is in a range of 1.0 µm to 5 µm.

For example, the depth of the inverted T-shaped groove is 0.5 µm, 0.8 µm, 1.4 µm, 2 µm, 4 µm, 6 µm, or 7 µm.

It will be noted that, in a case where the at least one insulation layer includes at least two insulation layers, at least at the position of the cathode blocking structure 16, surfaces of any two adjacent insulation layers of the at least two insulation layers, which are proximate to each other, are in contact.

By arranging the cathode blocking structure 16 as the groove 161 and arranging a cross section of the groove 161 to have an inverted T shape, in a case where the cathode 14 is disconnected at the position of the cathode blocking structure 16, the increase in the thickness of the display panel 1 may be avoided, which is beneficial to the thinning of the display panel 1.

Figure 5:
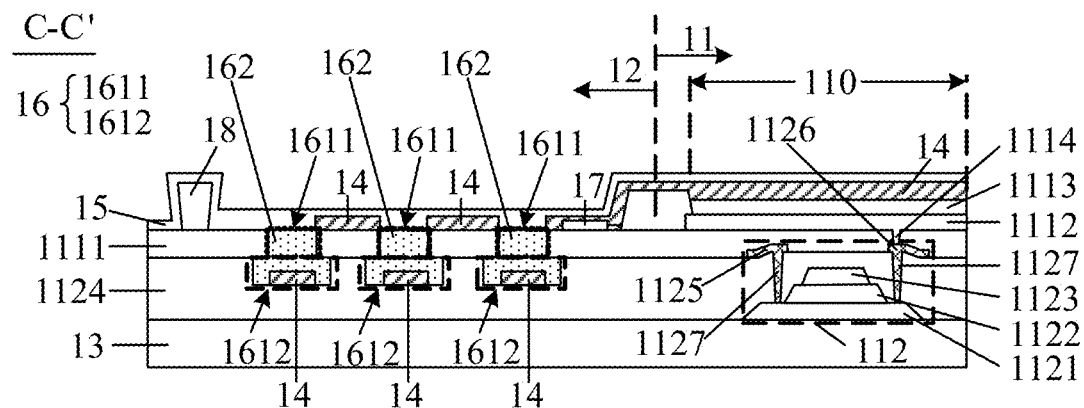
FIG. 5 is a cross-sectional view taken along a C-C' direction in FIG. 2A, in accordance with some embodiments.
Figure 6:
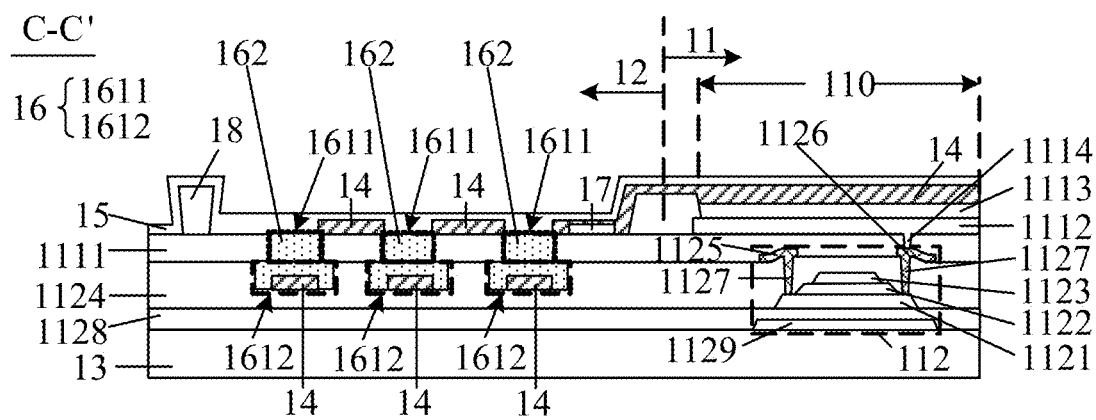
FIG. 6 is another cross-sectional view taken along the C-C' direction in FIG. 2A, in accordance with some embodiments.
Figure 7:
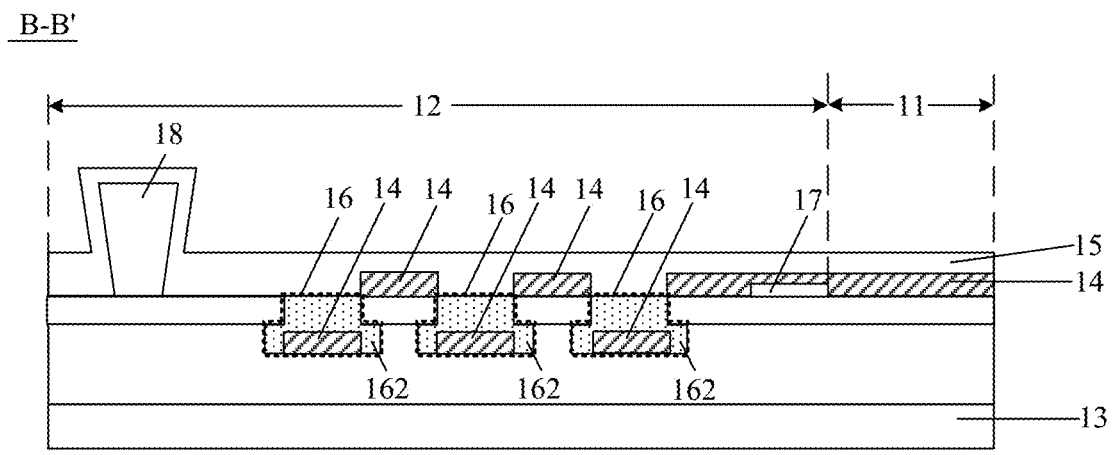
FIG. 7 is yet another cross-sectional view taken along the B-B' direction in FIG. 2A, in accordance with some embodiments.

In some embodiments, as shown in FIGS. 5 and 6, the at least one insulation layer includes two insulation layers that are stacked. The cathode blocking structure 16 includes a first sub-groove 1611 and a second sub-groove 1612 that are stacked and communicated in the thickness direction of the base 13. The first sub-groove 1611 and the second sub-groove 1612 are disposed in two insulation layers, respectively. For example, the first sub-groove 1611 is located in an insulation layer of the two insulation layers away from the base 13, and the second sub-groove 1612 is located in an insulation layer of the two insulation layers proximate to the base 13. Correspondingly, at a boundary of the active area 11 where the cathode blocking structure 16 is disposed, a width of the first sub-groove 1611 is less than a width of the second sub-groove 1612 in a direction perpendicular to the boundary.

In some embodiments, as shown in FIGS. 5 to 8, the display unit 10 further includes at least one first organic filling pattern 162, and each first organic filling pattern 162 fills a corresponding cathode blocking structure 16, and a surface of the first organic filling pattern 162 facing away from the base 13 is flush with a surface of an insulation layer furthest away from the base 13.

By filling the first organic filling pattern 162 at the position of the cathode blocking structure 16 and making the surface of the first organic filling pattern 162 facing away from the base 13 flush with the surface of the insulation layer furthest away from the base 13, during the subsequent manufacturing of the film encapsulation layer 15, it is possible to prevent the film encapsulation layer 15 from being broken at the cathode blocking structure 16 due to a step difference, which affects the encapsulation performance. In addition, the organic material has good ductility and flexibility. By arranging the first organic filling pattern 162, the ductility and flexibility of the display panel 1 may be increased.

In some examples, the first organic filling pattern 162 includes an organic material and desiccant doped in the organic material. For example, the organic material is epoxy resin or phenolic resin. The organic material is doped with desiccant, which may improve barrier ability of the film encapsulation layer 15 to water and oxygen, and improve the encapsulation reliability.

In some embodiments, as shown in FIGS. 1B, 1C, 2B, and 4 to 8, the display unit 10 further includes a barrier block 18 disposed on a side of the film encapsulation layer 15 proximate to the base 13 in the thickness direction of the base 13, and the barrier block 18 is disposed in the peripheral area 12. At a boundary of the active area 11 where the cathode blocking structure 16 and the barrier block 18 are disposed, the barrier block 18 is located at a side of the cathode blocking structure 16 away from the active area 11.

At a boundary of the active area 11 where the barrier block 18 is disposed, a cross section of the barrier block 18 cut by a plane perpendicular to the boundary is an inverted trapezoid.

For example, in a case where the barrier block 18 is located at the first boundary 11A of the active area 11, a cross section of the barrier block 18 cut by the plane perpendicular to the first boundary 11A is an inverted trapezoid. For another example, in a case where the barrier block 18 is located at the second boundary 11B of the active area 11, a cross section of the barrier block 18 cut by the plane perpendicular to the second boundary 11B is an inverted trapezoid. For another example, in a case where the barrier block 18 is disposed around the active area 11, a cross section of a part of the barrier block 18 located at each boundary of the active area 11 cut by a plane perpendicular to the boundary is an inverted trapezoid.

In some examples, the barrier block 18 is disposed around the active area 11, and the barrier block 18 has a ring structure and is continuous or segmented. The ring structure may be a circular ring, a square ring or other special-shaped ring.

In some examples, the film encapsulation layer 15 includes an inorganic encapsulation layer, and the inorganic encapsulation layer covers the barrier block 18.

By providing the barrier block 18 with an inverted trapezoidal cross-section, in the display panel 1, especially a stretchable display panel, in a case where the edge of the film encapsulation layer 15 is subjected to a large stress and crack(s) appear, the barrier block 18 may block the crack to prevent the crack from extending to the active area 11. The crack(s) cause water and oxygen to invade the active area 11, thereby affecting the performance of the display panel 1.

In some embodiments, as shown in FIG. 8, the display unit 10 further includes a depression portion 163 and a second organic filling pattern 164. The depression portion 163 is disposed in the at least one insulation layer, and an orthogonal projection of the depression portion 163 on the base 13 overlaps with an orthogonal projection of the barrier block 18 on the base 13.

The second organic filling pattern 164 is filled in the depression portion 163. A surface of the second organic filling pattern 164 facing away from the base 13 is flush with the surface of the insulation layer furthest away from the base 13. The barrier block 18 is disposed on the surface of the second organic filling pattern 164 facing away from the base 13.

In a case where the at least one insulation layer includes two insulation layers that are stacked, in some examples, the depression portion 163 is located in an insulation layer of the two insulation layers away from the base 13.

The second organic filling pattern 164 includes an organic material, and the organic material has good ductility and flexibility. By arranging the second organic filling pattern 164 at the depression portion 163, the ductility and flexibility of the display panel 1 may be increased. Meanwhile, in a case where the barrier block 18 is made of organic material(s), since the adhesion between organic materials is good, the adhesion between the barrier block 18 and the surface of the at least one insulation layer facing away from the base 13 may be improved, which may prevent the film encapsulation layer 15 from cracking due to the peeling of the barrier block 18 and the surface of the at least one insulation layer facing away from the base 13, and further improves the encapsulation.

In some examples, the second organic filling pattern 164 includes an organic material and desiccant doped in the organic material. The organic material may be epoxy resin, phenolic resin, etc. For example, the material of the second organic filling pattern 164 is the same as that of the first organic filling pattern 162. By doping the desiccant in the organic material used for manufacturing the second organic filling pattern 164, the barrier ability of the film encapsulation layer 15 to water and oxygen may be improved, and the encapsulation reliability may be improved.

In some embodiments, as shown in FIGS. 5 and 6, the display unit 10 further includes a plurality of pixel driving circuits disposed on the base 13 and located in the active area 11, and a planarization layer 1111 disposed at a side of the plurality of pixel driving circuits away from the base 13, a plurality of anodes 1112 disposed at a side of the planarization layer 1111 away from the base 13 and a plurality of light-emitting functional layers 1113.

The pixel driving circuit includes a plurality of thin film transistors 112. As shown in FIGS. 5 and 6, at least one of the plurality of thin film transistors 112 includes a semiconductor active pattern 1121, a gate 1123, a portion of an interlayer insulation layer 1124 located in a region in which the thin film transistor 112 is located, a source 1125 and a drain 1126 that are sequentially disposed on the base 13, and the source 1125 and the drain 1126 are in contact with the semiconductor active pattern 1121 at least through first via holes 1127 in the interlayer insulation layer 1124. In some examples, the thin film transistor 112 further includes a gate insulating pattern 1122 disposed between the semiconductor active pattern 1121 and the gate 1123. In this case, the source 1125 and the drain 1126 are respectively in contact with the semiconductor active pattern 1121 through the first via holes 1127 in the interlayer insulation layer 1124. In some other examples, the thin film transistor 112 further includes a portion of a first gate insulation layer disposed between the semiconductor active pattern 1121 and the gate 1123 in the region in which the thin film transistor 112 is located. In this case, the source 1125 and the drain 1126 are respectively in contact with the semiconductor active pattern 1121 through the first via holes 1127 penetrating the interlayer insulation layer 1124 and the first gate insulation layer.

Each light-emitting functional layer 1113 is located between a corresponding anode 1112 and the cathode 14. The anode 1112 is connected with the pixel driving circuit through a second via hole 1114 in the planarization layer 1111. The light-emitting functional layer 1113, the anode 1112 and the cathode 14 located on both sides of the light-emitting functional layer 1113 constitute a light-emitting device.

In some examples, the light-emitting functional layer 1113 includes a light-emitting layer. In some other examples, in addition to the light-emitting layer, the light-emitting functional layer 1113 further includes an electron transporting layer (ETL), an electron injection layer (EIL), a hole transporting layer (HTL) and a hole injection layer (HIL). The electron transporting layer and the electron injection layer are disposed between the light-emitting layer and the cathode 14, and the electron injection layer is closer to the cathode 14 than the electron transporting layer. The hole transporting layer and the hole injection layer are disposed between the light-emitting layer and the anode 1112, and the hole injection layer is closer to the anode 1112 than the hole transporting layer. On this basis, electron transporting layers in all light-emitting devices may be located in a same layer, electron injection layers in all light-emitting devices may be located in a same layer, hole transporting layers in all light-emitting devices may be located in a same layer, and hole injection layers in all light-emitting devices may be located in a same layer.

As shown in FIG. 2A, the active area 11 includes a plurality of sub-pixel regions 110, and each pixel driving circuit and a light-emitting element electrically connected to the pixel driving circuit are disposed in a corresponding sub-pixel region 110.

It will be noted that, FIG. 5 illustrates that the thin film transistor 112 is a top-gate thin film transistor, but the embodiments of the present disclosure are not limited to this, and the thin film transistor 112 may also be any of a bottom-gate thin film transistor or a double-gate thin film transistor. With respect to a double-gate thin film transistor, as shown in FIG. 6, the thin film transistor 112 further includes a portion of another gate insulation layer 1128 disposed on a side of the semiconductor active pattern 1121 proximate to the base 13 and located in the region where the thin film transistor 112 is located, and another gate 1129 disposed on a side of the another gate insulation layer 1128 proximate to the base 13.

In addition, the embodiments of the present disclosure do not limit the number of the plurality of thin film transistors 112 in the pixel driving circuit. For example, the number of the plurality of thin film transistors 112 is two. For another example, the number of the plurality of thin film transistors 112 is five. For yet another example, the number of the plurality of thin film transistors 112 is seven. FIGS. 5 and 6 only illustrate one thin film transistor 112 in the pixel driving circuit.

In some examples, the structure of each thin film transistor 112 in the pixel driving circuit is the structure shown in FIG. 5 or 6, and details may be referred to the above description, which will not be repeated here.

The planarization layer 1111 and the interlayer insulation layer 1124 both extend from the active area 11 to the peripheral area 12, and the at least one insulation layer includes the planarization layer 1111 and the interlayer insulation layer 1124. In a case where the at least one insulation layer includes two insulation layers, the two insulation layers are a planarization layer 1111 and an interlayer insulation layer 1124. Correspondingly, in a case where the cathode blocking structure 16 includes the first sub-groove 1611 and the second sub-groove 1612 that are stacked and communicated in the thickness direction of the base 13, the first sub-groove 1611 is disposed in the planarization layer 1111 and penetrates the planarization layer 1111, and the second sub-groove 1612 is disposed in the interlayer insulation layer 1124.

In some examples, the second sub-groove 1612 penetrates the interlayer insulation layer 1124. In some other examples, as shown in FIGS. 5 and 6, the second sub-groove 1612 does not penetrate the interlayer insulation layer 1124. That is, in the thickness direction of the base 13, a depth of the second sub-groove 1612 is less than a thickness of the interlayer insulation layer 1124.

In some examples, in the thickness direction of the base 13, a depth of the first sub-groove 1611 is in a range of 0.3 μm to 2 μm. For example, the depth of the first sub-groove 1611 is 0.3 μm, 0.6 μm, 0.9 μm, 1 μm, 1.5 μm, or 2 μm.

In some examples, in the thickness direction of the base 13, the depth of the second sub-groove 1612 is in a range of 0.2 μm to 5 μm. For example, the depth of the second sub-groove 1612 is 0.2 μm, 0.5 μm, 0.8 μm, 1 μm, 1.5 μm, 2 μm, 3 μm, 4 μm, or 5 μm.

In some examples, at a boundary of the active area 11 where the cathode blocking structure 16 is provided, in the direction perpendicular to the boundary, the width of the second sub-groove 1612 is in a range of 5 μm to 50 μm, and the width of the first sub-groove 1611 is in a range of 2 μm to 40 μm.

For example, the width of the second sub-groove 1612 is 5 μm, 10 μm, 13 μm, 20 μm, 30 μm, 40 μm, or 50 μm. For another example, the width of the first sub-groove 1611 is 2 μm, 6 μm, 10 μm, 13 μm, 20 μm, 30 μm, or 40 μm.

Some embodiments of the present disclosure provide a display apparatus including the display panel 1.

The display apparatus may be any product or component having a display function, such as a mobile phone, a tablet computer, a television, a display, a notebook computer, a digital photo frame, or a navigator.

Some embodiments of the present disclosure provide a method for manufacturing the display panel 1. The method includes forming at least one display unit 10 on a base 13, and each display unit 10 includes an active area 11 and a peripheral area 12 surrounding the active area 11.

As shown in FIG. 9, forming the display unit 10 includes the following steps.

In S10, as shown in FIGS. 1B and 1C, at least one cathode blocking structure 16 located in the peripheral area 12 is formed above the base 13.

The arrangement manner of the at least one cathode blocking structure 16 may refer to the foregoing description, which will not be repeated here.

In S11, as shown in FIGS. 1B and 1C, a cathode 14 is formed above the base 13 above which the at least one cathode blocking structure 16 has been formed; and the cathode 14 is located in the active area 11 and the peripheral area 12, and the cathode 14 is disconnected at the position of the at least one cathode blocking structure 16.

In S12, as shown in FIGS. 1B and 1C, a film encapsulation layer 15 is formed on a side of the cathode 14 facing away from the base 13; and the film encapsulation layer 15 covers the cathode 14, and an edge of the film encapsulation layer 15 extends beyond an edge of the cathode 14.

In some embodiments, as shown in FIG. 4, the at least one cathode blocking structure 16 is a groove 161 formed in at least one insulation layer; and at a boundary of the active area 11 where the cathode blocking structure 16 has been formed, a cross section of the groove 161 cut by a plane perpendicular to the boundary has an inverted T shape.

In some embodiments, as shown in FIGS. 5 and 6, before forming the cathode 14, forming the display unit further includes the following steps.

In S20, a plurality of pixel driving circuits are formed above the base 13 and located in the active area 11; the pixel driving circuit includes a plurality of thin film transistors 112, and at least one of the plurality of thin film transistors 112 includes a semiconductor active pattern 1121, a gate 1123, a portion of an interlayer insulation layer 1124 located in the region in which the thin film transistor 112 is located, a source 1125 and a drain 1126 that are sequentially formed on the base 13; and the source 1125 and the drain 1126 are in contact with the semiconductor active pattern 1121 at least through first via holes 1127 in the interlayer insulation layer 1124.

The structures of the thin film transistor 112 and the pixel driving circuit may refer to the foregoing description.

In S21, a planarization layer 1111 is formed above the base 13 on which a plurality of pixel driving circuits have been formed.

In S22, a plurality of anodes 1112 and a plurality of light-emitting functional layers 1113 are formed at a side of the planarization layer 1111 away from the base 13, and each light-emitting functional layer 1113 is located between a corresponding anode 1112 and the cathode 14; and the anode 1112 is connected to the pixel driving circuit through a second via hole 1114 in the planarization layer 1111.

On this basis, the at least one insulation layer includes an interlayer insulation layer 1124 and a planarization layer 1111; and the cathode blocking structure 16 includes a first sub-groove 1611 and a second sub-groove 1612 that are stacked and communicated in the thickness direction of the base 13, and the first sub-groove 1611 is located in the planarization layer 1111 and penetrates the planarization layer 1111, and the second sub-groove 1612 is located in the interlayer insulation layer 1124. For example, the first sub-groove 1611 and the second sub-groove 1612 may be formed through an etching process.

In some examples, in the thickness direction of the base 13, the depth of the first sub-groove 1611 is in a range of 0.3 μm to 2 μm, such as 0.6 μm. The depth of the second sub-groove 1612 is in a range of 0.2 μm to 5 μm, such as 0.8 μm.

In some other examples, at a boundary of the active area 11 where the cathode blocking structure 16 is provided, in the direction perpendicular to the boundary, the width of the second sub-groove 1612 is in a range of 5 μm to 50 μm, such as 13 μm. The width of the first sub-groove 1611 is in a range of 2 μm to 40 μm, such as 6 μm.

In some embodiments, after forming the interlayer insulation layer 1124 and before forming the planarization layer 1111, forming the display unit further includes the following steps.

Figure 10:
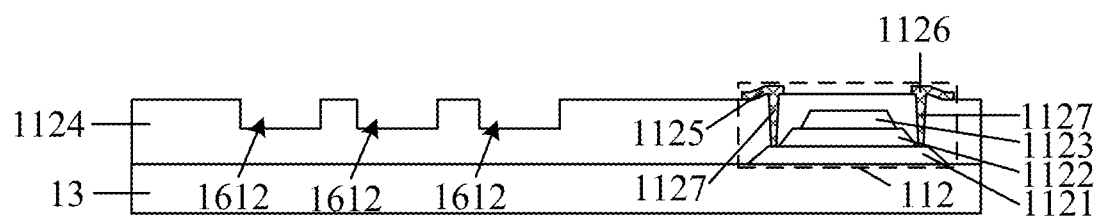
FIG. 10 is a process diagram of manufacturing second sub-grooves and a thin film transistor, in accordance with some embodiments.
Figure 11:
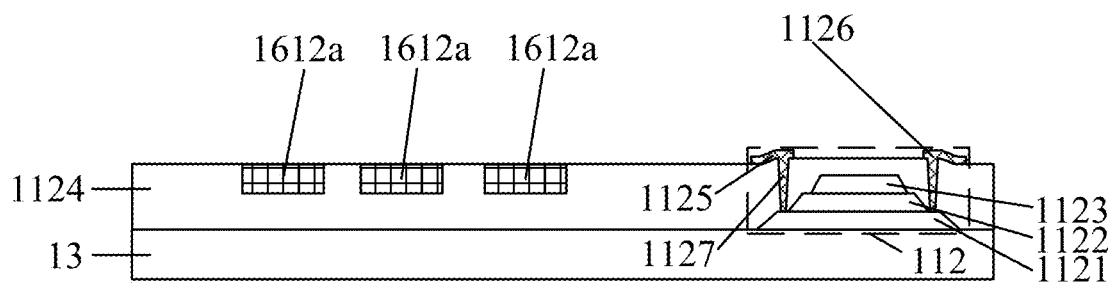
FIG. 11 is a process diagram of filling the second sub-grooves with photoresist, in accordance with some embodiments.
Figure 12:
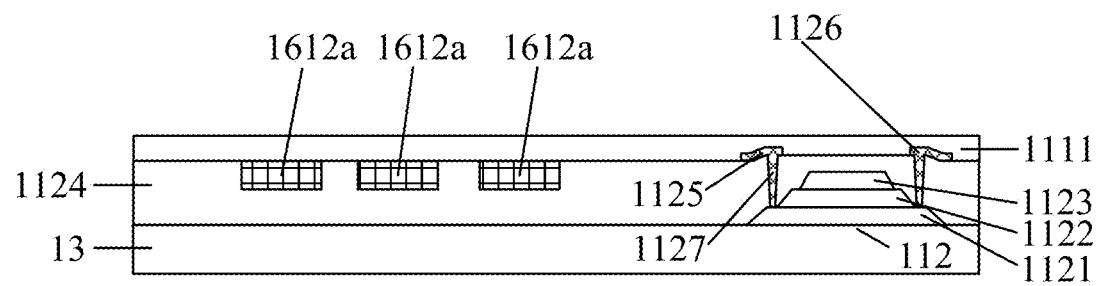
FIGS. 12 and 13 are process diagrams of manufacturing a planarization layer, in accordance with some embodiments.

As shown in FIGS. 10 and 11, the second sub-groove 1612 in the interlayer insulation layer 1124 is filled with photoresist 1612a, and a surface of the photoresist 1612a facing away from the base 13 is flush with a surface of the interlayer insulation layer 1124 facing away from the base 13.

As shown in FIG. 11, the photoresist 1612a is exposed.

In some embodiments, after forming the planarization layer 1111 including the first sub-groove 1611 and before developing the photoresist 1612a filled in the second sub-groove 1612, forming the display unit further includes the following steps.

Figure 13:
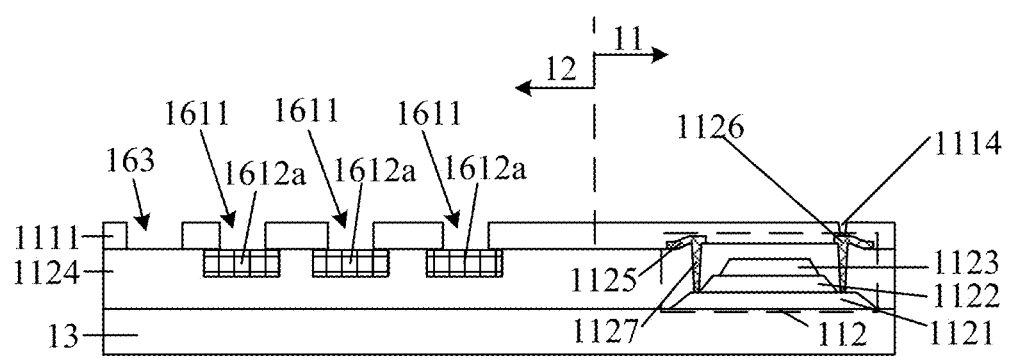
Figure 14:
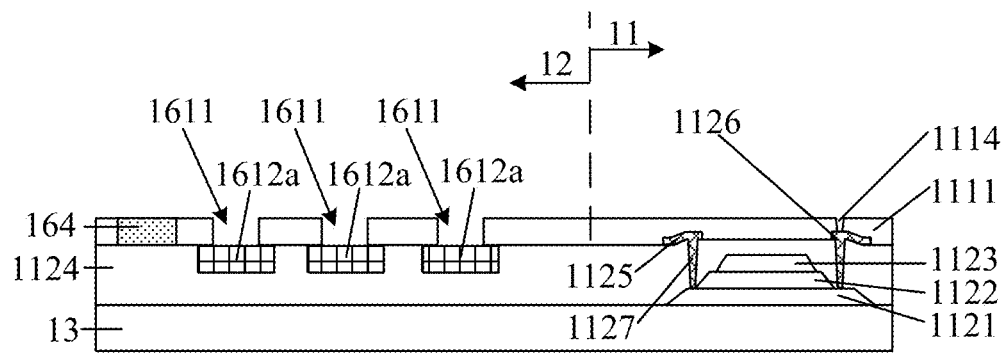
FIG. 14 is a process diagram of filling a second organic filling pattern, in accordance with some embodiments.
Figure 15:
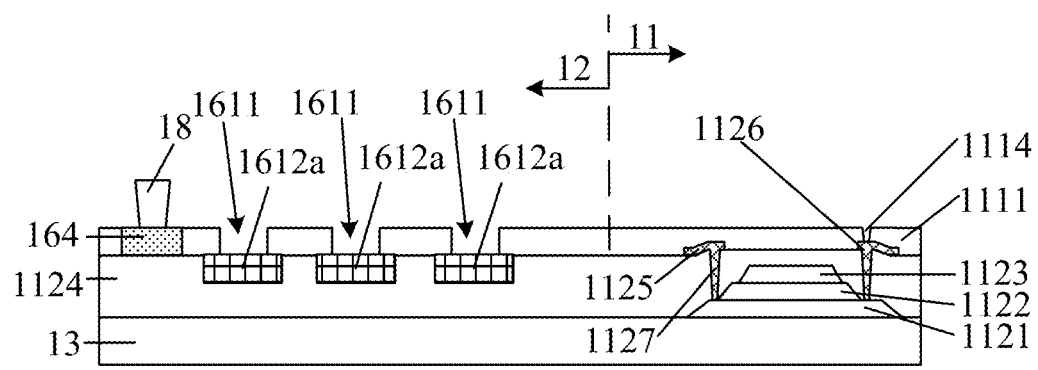
FIG. 15 is a process diagram of manufacturing a barrier block, in accordance with some embodiments.

As shown in FIGS. 13 to 15, a barrier block 18 is formed in the peripheral area 12, and at a boundary of the active area 11 where the cathode blocking structure 16 and the barrier block 18 have been formed, the barrier block 18 is located at the side of the cathode blocking structure 16 away from the active area 11; and at the boundary of the active area 11 where the barrier block 18 has been formed, a cross section of the barrier block 18 cut by a plane perpendicular to the boundary is an inverted trapezoid.

In some examples, as shown in FIG. 13, while the first sub-groove 1611 and the second via hole 1114 are formed in the planarization layer 1111, a depression portion 163 located in the peripheral area 12 is also formed in the planarization layer 1111. An orthogonal projection of the depression portion 163 on the base 13 overlaps with an orthogonal projection of the barrier block 18 on the base 13. For example, the depression portion 163 may be formed through an etching process.

In some examples, before developing the photoresist 1612a filled in the second sub-groove 1612, forming the display unit further includes the following steps.

Figure 16:
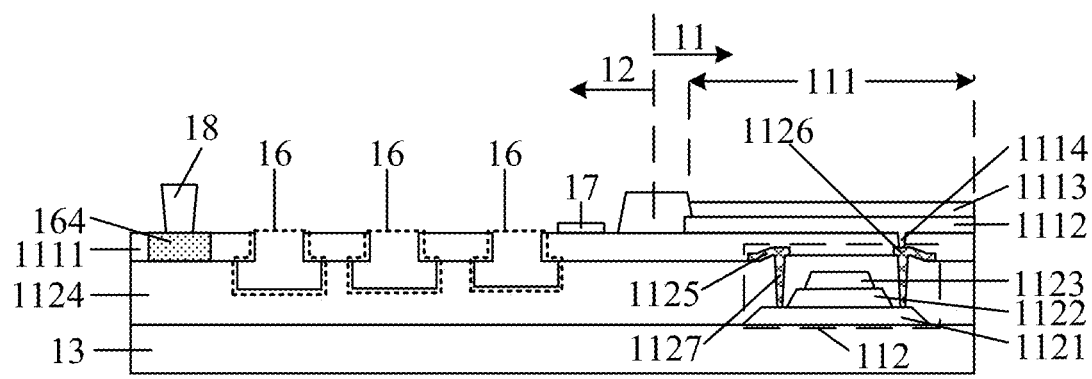
FIG. 16 is a process diagram of developing photoresist and manufacturing anodes and light-emitting functional layers, in accordance with some embodiments.

As shown in FIGS. 14 to 16, the second organic filling pattern 164 is filled in the depression portion 163 and cured. A surface of the second organic filling pattern 164 facing away from the base 13 is flush with a surface of the planarization layer 1111 facing away from the base 13; the second organic filling pattern 164 includes an organic material and desiccant doped in the organic material; and the barrier block 18 is in contact with the surface of the second organic filling pattern 164 facing away from the base 13.

On this basis, in some embodiments, after forming the planarization layer 1111 including the first sub-groove 1611 and before forming the cathode 14, forming the display unit further includes the following steps.

As shown in FIGS. 15 and 16, the photoresist 1612*a* filled in the second sub-groove 1612 is developed.

As shown in FIG. 16, after the photoresist 1612*a* filled in the second sub-groove 1612 is developed, and the first sub-groove 1611 and the second sub-groove 1612 jointly form the cathode blocking structure 16.

In some embodiments, after forming the cathode 14 and before forming the film encapsulation layer, forming the display unit further includes the following steps.

Figure 17:
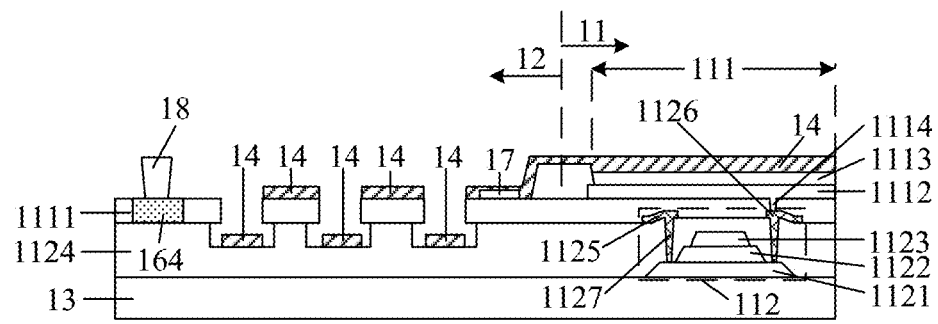
FIG. 17 is a process diagram of manufacturing a cathode, in accordance with some embodiments.
Figure 18:
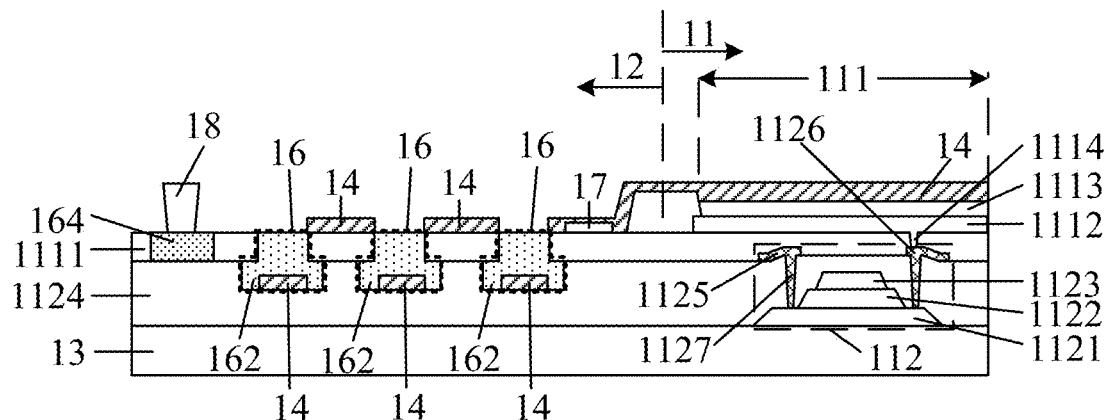
FIG. 18 is a process diagram of filling a first organic filling pattern, in accordance with some embodiments.

As shown in FIGS. 17 and 18, at the position of the cathode blocking structure 16, the first organic filling pattern 162 is filled and cured; the surface of the first organic filling pattern 162 facing away from the base 13 is flush with the surface of the planarization layer 1111 facing away from the base 13; and the first organic filling pattern 162 includes an organic material and desiccant doped in the organic material.

In the method for manufacturing the display panel 1 provided by some embodiments of the present disclosure, by providing the cathode blocking structure 16 in the peripheral area 12, the cathode 14 is disconnected at the position of the cathode blocking structure 16, and the cathode 14 is divided into a main body portion and an edge portion. The main body portion is located at the side of the cathode blocking structure 16 proximate to the active area 11, and the main body portion covers the active area 11. Compared with a distance between the side face of the cathode 14 and a corresponding side face of the film encapsulation layer 15 in the case where the cathode blocking structure 16 is not disposed, the arrangement of the cathode blocking structure 16 increases a distance between the side face of the main body portion of the cathode 14 facing the cathode blocking structure 16 and the corresponding side face of the film encapsulation layer 15, thereby increasing the path of water and oxygen intrusion into the main body portion and ensuring the reliability of the encapsulation. On this basis, considering that there is an alignment problem when the cathode 14 is formed through evaporation deposition, in order to ensure that the main body portion can also be formed in a predetermined region in a case where the alignment accuracy is low, the purpose may be achieved by increasing an area of the cathode 14 that is formed through evaporation deposition. And the arrangement of the cathode blocking structure 16 may ensure the encapsulation reliability even if an overall size of the cathode 14 is large.

In some embodiments, the base 13 includes a plurality of islands 131 separated from each other and a plurality of bridges 132 connecting the plurality of islands 131. The region in which each island 131 is located is the region in which a display unit 10 is located.

In some embodiments, after forming the cathode blocking structure 16 and before forming the cathode 14, the method for manufacturing the display panel 1 further includes: forming a connection electrode 17 above the base 13 and located in the peripheral area 12, and the connection electrode 17 is located on the island 131 and located at the side of the cathode blocking structure 16 proximate to the active area 11.

The connection electrode 17 is directly connected to the cathode 14, and any two connection electrodes 17 disposed on different islands 131 are electrically connected through a connecting line located on a bridge 132.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
a base; and
at least one display unit disposed on the base, and the at least one display unit having an active area and a peripheral area surrounding the active area; and the display unit including:
a cathode disposed above the base; and the cathode being located in the active area and the peripheral area;
a film encapsulation layer disposed above the base; and the film encapsulation layer being disposed on a side of the cathode facing away from the base, the film encapsulation layer covering the cathode, and an edge of the film encapsulation layer extending beyond an edge of the cathode;
at least one cathode blocking structure disposed on a side of the cathode proximate to the base; and the at least one cathode blocking structure being disposed in the peripheral area, and each cathode blocking structure being configured such that the cathode is disconnected at a position of the cathode blocking structure, wherein each cathode blocking structure is a groove disposed in at least one insulation layer, at a boundary of the active area where the cathode blocking structure is provided, and a cross section of the groove cut by a plane perpendicular to the boundary has an inverted T shape; and
at least one first organic filling pattern, each first organic filling pattern is filled at a position of a corresponding cathode blocking structure, and a surface of the first organic filling pattern facing away from the base is flush with a surface of the at least one insulation layer facing away from the base; wherein the first organic filling pattern includes an organic material and desiccant doped in the organic material.

2. The display panel according to claim 1, wherein each cathode blocking structure is disposed around the active area.

3. The display panel according to claim 2, wherein the at least one cathode blocking structure includes a plurality of cathode blocking structures, and the plurality of cathode blocking structures are arranged separately.

4. The display panel according to claim 1, wherein the base includes a plurality of islands separated from each other and a plurality of bridges connecting the plurality of islands;
a region in which each island is located is a region in which the display unit is located; and there is a connecting line disposed on a bridge;
and the display unit further includes:
a connection electrode disposed above the base; the connection electrode being located in the peripheral area, and the connection electrode being disposed on the side of the cathode proximate to the base and the connection electrode being directly connected to the cathode; and any cathode blocking structure disposed at a same side of the active area as the connection electrode being disposed at a side of the connection electrode away from the active area; wherein any two connection electrodes disposed on different islands are electrically connected through the connecting line disposed on the bridge.

5. The display panel according to claim 1, wherein the at least one insulation layer includes two insulation layers that are stacked; and the cathode blocking structure includes a first sub-groove and a second sub-groove that are stacked and communicated in a thickness direction of the base, and the first sub-groove and the second sub-groove are respectively disposed in the two insulation layers.

6. The display panel according to claim 5, wherein the display unit further includes:

a plurality of pixel driving circuits disposed on the base and located in the active area; and a pixel driving circuit including a plurality of thin film transistors, and at least one thin film transistor includes a semiconductor active pattern, a gate, a portion of an interlayer insulation layer located in a region in which the at least one thin film transistor is located, a source and a drain that are sequentially disposed on the base, and the source and the drain being in contact with the semiconductor active pattern at least through first via holes in the interlayer insulation layer;

a planarization layer disposed on a side of the plurality of pixel driving circuits facing away from the base;

a plurality of anodes and a plurality of light-emitting functional layers disposed on a side of the planarization layer facing away from the base, and each light-emitting functional layer being located between a corresponding anode and the cathode; and the anode being connected to the pixel driving circuit through a second via hole in the planarization layer; wherein the two insulation layers are the interlayer insulation layer and the planarization layer.

7. The display panel according to claim 1, wherein the display unit further includes:

a barrier block disposed on a side of the film encapsulation layer proximate to the base, and the barrier block being disposed in the peripheral area; at a boundary of the active area where the cathode blocking structure and the barrier block are provided, the barrier block being located at a side of the cathode blocking structure away from the active area; wherein at a boundary of the active area where the barrier block is provided, a cross section of the barrier block cut by a plane perpendicular to the boundary is an inverted trapezoid.

8. A display apparatus, comprising a display panel, the display panel comprising:

a base; and at least one display unit disposed on the base, and the at least one display unit having an active area and a peripheral area surrounding the active area; and the display unit including:

a cathode disposed above the base; and the cathode being located in the active area and the peripheral area;

a film encapsulation layer disposed above the base; and the film encapsulation layer being disposed on a side of the cathode facing away from the base, the film encapsulation layer covering the cathode, and an edge of the film encapsulation layer extending beyond an edge of the cathode;

at least one cathode blocking structure disposed on a side of the cathode proximate to the base; and the at least one cathode blocking structure being disposed in the peripheral area, and each cathode blocking structure being configured such that the cathode is disconnected at a position of the cathode blocking structure, wherein each cathode blocking structure is a groove disposed in at least one insulation layer, at a boundary of the active area where the cathode blocking structure is provided, and a cross section of the groove cut by a plane perpendicular to the boundary has an inverted T shape; and at least one first organic filling pattern, each first organic filling pattern is filled at a position of a corresponding cathode blocking structure, and a surface of the first organic filling pattern facing away from the base is flush with a surface of the at least one insulation layer facing away from the base; wherein the first organic filling pattern includes an organic material and desiccant doped in the organic material.

* * * * *